(12) United States Patent
Oda et al.

(10) Patent No.: US 6,818,971 B2
(45) Date of Patent: Nov. 16, 2004

(54) LEAD FRAME FOR RESIN-MOLDED SEMICONDUCTOR DEVICE

(75) Inventors: Yoshinori Oda, Nagano (JP); Atsushi Maruyama, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 150 days.

(21) Appl. No.: 10/347,306

(22) Filed: Jan. 21, 2003

(65) Prior Publication Data

US 2003/0141579 A1 Jul. 31, 2003

(30) Foreign Application Priority Data

Jan. 28, 2002 (JP) ........................................ 2002-017951

(51) Int. Cl.[7] .............................................. H01L 23/495
(52) U.S. Cl. .................... 257/667; 257/692; 257/724
(58) Field of Search ................................. 257/665–677, 257/676, 690, 692–694, 735, 723–724; 438/107, 110–112, 121, 123–127

(56) References Cited

U.S. PATENT DOCUMENTS 5,293,064 A * 3/1994 Yoshimoto et al. ......... 257/666
5,637,914 A * 6/1997 Tanaka et al. .............. 257/666
6,265,762 B1 * 7/2001 Tanaka et al. .............. 257/676

* cited by examiner

Primary Examiner—Tuan H. Nguyen
Assistant Examiner—Thanhha Pham
(74) Attorney, Agent, or Firm—Manabu Kanesaka

(57) ABSTRACT

A lead frame for a resin-molded semiconductor device is provided with die pads for separately mounting chips of power elements and a control IC thereon; terminal leads arranged in a row at one side and including leads for the die pads, and a main circuit, a control power supply and signal circuit separated from the die pads; and a dam bar connecting the terminal leads. In the main circuit terminals and control power supply terminals, a plurality of leads is formed and drawn in advance. After the lead frame is set in a mold die and is resin-molded, certain leads that are not used as the terminal leads are selected among the plurality of the leads, and the certain leads are cut and removed together with the dam bar.

6 Claims, 2 Drawing Sheets

LEAD FRAME FOR RESIN-MOLDED SEMICONDUCTOR DEVICE

BACKGROUND OF THE INVENTION AND RELATED ART STATEMENT

The present invention relates to a lead frame for a resin-molded semiconductor device such as a multi-chip, power device serving as a control device applied to, for example, a power circuit (switching power supply).

In a case of a control device applied to a power circuit as an example, structures of a single-end type resin-molded semiconductor device and a conventional lead frame used for assembling the semiconductor device will be, described with reference to FIGS. 2(a) to 2(c). FIG. 2(a) is a plan view showing the lead frame, FIG. 2(b) is a view showing an assembled state that semiconductor elements are mounted and wire-bonded on the lead frame, and FIG. 2(c) is a plan view showing an appearance of the semiconductor device with leads being cut after resin-molding. In FIGS. 2(a) to 2(c), a reference numeral 1 denotes a lead frame; reference numerals 2 and 3 are power elements (switching elements) mounted on the lead frame 1; a reference numeral 4 is a control IC for the power elements 2 and 3; a reference numeral 5 is a bonding wire for internal wiring; and a reference numeral 6 is a resin package formed by resin-molding for surrounding the power element 2, the control IC 4, and the bonding wires 5.

In the conventional lead frame 1 shown in FIG. 2(a), a side rail 1a and a side rail 1b are disposed to extend at both sides of the lead frame 1 as a tie bar for transporting the lead frame 1 pitch by pitch. In between the side rails, die pads 7, 8 and 9 having all of leads arranged at one side with a regular interval; terminal leads 10 of a main circuit, control power supply, and signal circuit, separated from the die pads and extended to a side of the side rail 1b (numbers 1, 2, ... assigned to the respective terminal leads 10 are terminal numbers), and a dam bar 11 connecting each of the terminal leads 10, are formed in a pattern in accordance with an outer dimension of the semiconductor device. It should be noted that the side rail 1a is connected to the die pad 7 via a tie bar 1a-1.

In a process of assembling the semiconductor device, the lead frame 1 is transported sequentially between steps. In the first step, chips of the power semiconductor elements 2 and 3 and the control IC 4 are mounted (die-bonded) on the die pads 7, 8, and 9 of the lead frame 1. In the next wiring step, the wires 5 are bonded between the terminal leads 10 and the power semiconductor elements 2, 3 and the control IC 4 for internal wiring. In the next molding (transfer molding) step, the lead frame 1 is set in a molding die (not shown), and a portion inside a mold line indicated by a hidden line in FIG. 2(b) is sealed with a resin to mold the resin package 6. Then, the side rails 1a and 1b and the dam bar 11 are cut to complete the semiconductor device shown in FIG. 2(c).

In the resin-molded semiconductor device assembled using the conventional lead frame shown in FIG. 2(a), however, there are problems in terms of the assembly and a cost as described below.

In a series of the steps performed on the lead frame for assembling the semiconductor device such as die bonding, wire bonding, and resin molding, the two side rails 1a and 1b extending at both sides support the patterned region of the conventional lead frame in order to ensure a strength enough for preventing the die pads patterned on the lead frame 1 and the wire-bonded terminal pads from warping or displacing while the lead frame is transported sequentially as shown in FIG. 2(a).

Thus, an additional step is required for cutting the tie bar after the resin molding, and an amount of pieces cut from the lead frame in the step (i.e. pieces such as the side rails and the dam bar) increases, thereby increasing a material cost of the lead frame. Moreover, in the completed state that the tie bar 1a-1 connecting the side rail 1a and the die pad 7 is cut-off after the resin-molding, as shown in FIG. 2(c), a remained part of the tie bar 1a-1 after cutting protrudes from an outside of the resin package 6 at a side opposite to the terminal leads 10, thereby exposing inner potential. Therefore, it is necessary to insulate the protruding part in an after-treatment step.

Further, when upgrading a version of the semiconductor device for adding a new function such as a protective function, the number of the terminals extended outside is increased according to a change in the circuit arrangement of the semiconductor device. Therefore, to manufacture the new version of the semiconductor device, the pattern of the lead frame is required to be changed, and the number of terminal leads led from the package to the outside is required to be increased. Therefore, it is necessary to produce a new molding die for the resin-molding in accordance with the increased number of the terminal leads, thereby increasing an investment for additional production equipment and a price of the semiconductor device.

It is therefore an object of the present invention to provide an improved lead frame for a resin-molded semiconductor device, which can reduce a material cost of the lead frame.

Another object of the invention is to provide a resin-molded semiconductor device as stated above, which can reduce the investment for additional production equipment in the case that the version of the semiconductor device is upgraded by adding a new function, thus improving the cost performance.

Further objects and advantages of the invention will be apparent from the following description of the invention.

SUMMARY OF THE INVENTION

To accomplish the above objects, according to the first aspect of the invention, a lead frame for a resin-molded semiconductor device is provided with die pads for separately mounting chips of power elements and a control IC thereon; terminal leads arranged in a row at one side and drawn from the die pads, and a main circuit, a control power supply and signal circuit separated from the die pads; and a dam bar connecting the terminal leads. In at least the power element, the main circuit terminals formed on the lead frame corresponding to the control IC, and the power elements, a plurality of leads is formed and drawn in advance. The power elements and the control IC mounted on the die pad are internally wired. After the lead frame is set in a mold die and is resin-molded, certain leads that are not used as the terminal leads are selected among the plurality of the leads, and the certain leads are cut and removed along with the dam bar.

As mentioned above, the number of the leads formed on the lead frame in advance is larger than the number of the terminals required for the semiconductor device. Thus, each lead serves as a beam to increase the mechanical strength (flexural rigidity) of the lead frame. Accordingly, it is possible to effectively eliminate warping or displacing of the lead frame during a series of steps of assembling the semiconductor device such as die bonding, wire bonding, and resin-molding performed on the lead frame.

Further, in a case that a version of the semiconductor device is upgraded by adding a protective function or the like, it is possible to cope with the upgraded version by changing only a part of the pattern of the inner leads and the die pads without modifying the arrangement of the outer leads relative to a basic pattern of the lead frame. Therefore, a resin package can be molded by using the existing molding die as it is without a new molding die.

Further, according to the second aspect of the invention, in addition to the configuration described above, a side rail of the lead frame is formed at only one side, and is connected to ends of the terminal leads. Specifically, the strength of the lead frame itself is improved by increasing the number of the leads. Thus, even though one side rail at the die pad side is omitted, the lead frame can be transported sequentially without any trouble as the side rail at one side connected to the ends of the terminal leads supports the die pads and the terminal leads. Since the side rail at one side is omitted, it is possible to reduce a material cost of the lead frame and the number of the steps required for cutting the tie bar after the resin-molding. Further, it is possible to eliminate a step of insulating because no part of the tie bar remains or is exposed from the outer surface of the resin package after cutting the tie bar.

Further, according to the third aspect of the invention, in addition to the configuration described above, dummy leads are formed along the terminal leads of the main circuit terminals with different potentials. The dummy leads are cut and removed along with the dam bar after the resin-molding. In the fourth aspect of the invention, inner ends of the dummy leads are cut along a mold line of a resin package.

With this arrangement, in the completed semiconductor device, a sufficient distance for insulation is formed between the terminal leads arranged at both sides with a space where the dummy lead has been removed, thereby ensuring a dielectric strength enough to withstand a main circuit voltage.

Further, in this case, the inner ends of the dummy leads may be extended up to the mold line of the resin package. Accordingly, the inner ends of the dummy leads prevent leakage of the resin from a molding die in the resin-molding step in which the lead frame is set in the molding die. Further, the dummy leads can be removed by cutting the dam bar because the inner ends of the dummy leads are not connected to the resin package after the resin-molding step.

BRIEF DESCRIPTION OF THE DRAWINGS

FIGS. 1(a)-1(c) are views showing structures of a lead frame and a semiconductor device according to an embodiment of the present invention, wherein FIG. 1(a) is a plan view showing a lead frame, FIG 1(b) is a view showing an assembled state in which semiconductor elements are mounted on the lead frame, and FIG. 1(c) is a plan view showing an appearance of the semiconductor device in a completed state after cutting leads and resin-molding; and FIGS. 2(a)-2(c) are views showing structures of a conventional lead frame and a semiconductor apparatus, wherein FIG. 2(a) is a plan view showing a lead frame itself, FIG. 2(b) is a view showing an assembled state in which semiconductor elements are mounted on the lead frame, and FIG. 2(c) is a plan view showing an appearance of the semiconductor device in a completed state after cutting leads and resin-molding.

DETAILED DESCRIPTION OF PREFERRED EMBODIMENTS

Figure 1A:
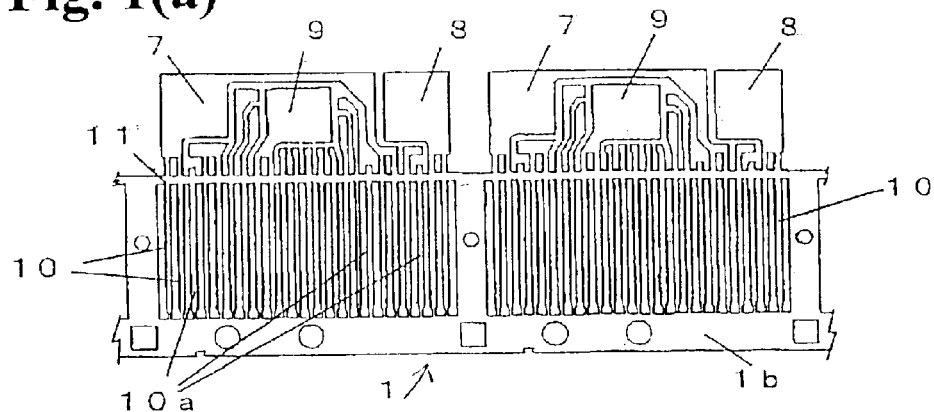
Figure 1B:
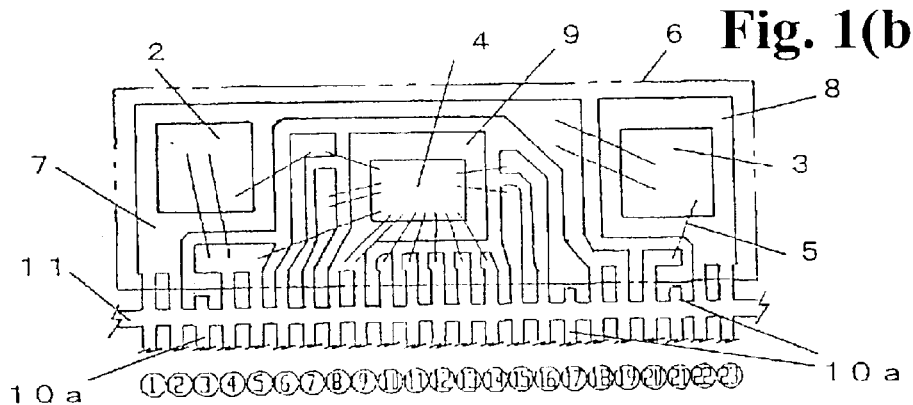
Figure 1C:
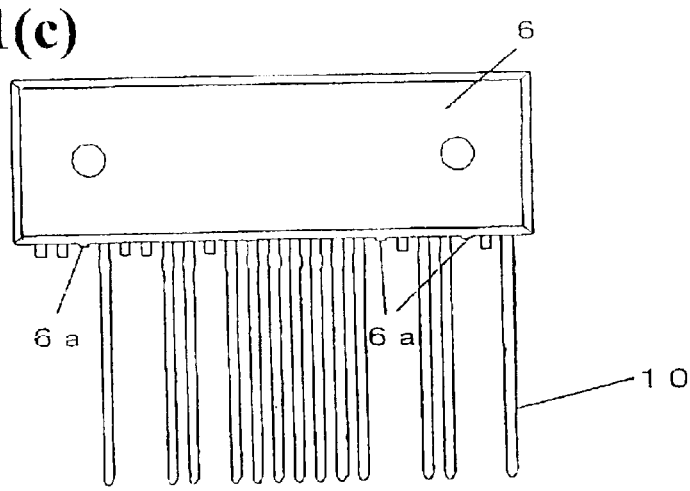

Hereunder, embodiments of the present invention will be described in detail with reference to FIGS. 1(a) to 1(c). FIG. 1(a) is a plan view showing lead frames, FIG. 1(b) is a view showing an assembled state in which semiconductor elements are mounted on the lead frame and wire-bonded, and FIG. 1(c) is a plan view showing an appearance of a semiconductor device in a completed state after cutting leads and resin-molding. Elements and parts shown in FIGS. 1(a)-1(c) corresponding to those shown in FIGS. 2(a)-2(c) are denoted by the same reference numerals, and a description thereof is omitted.

Figure 2A:
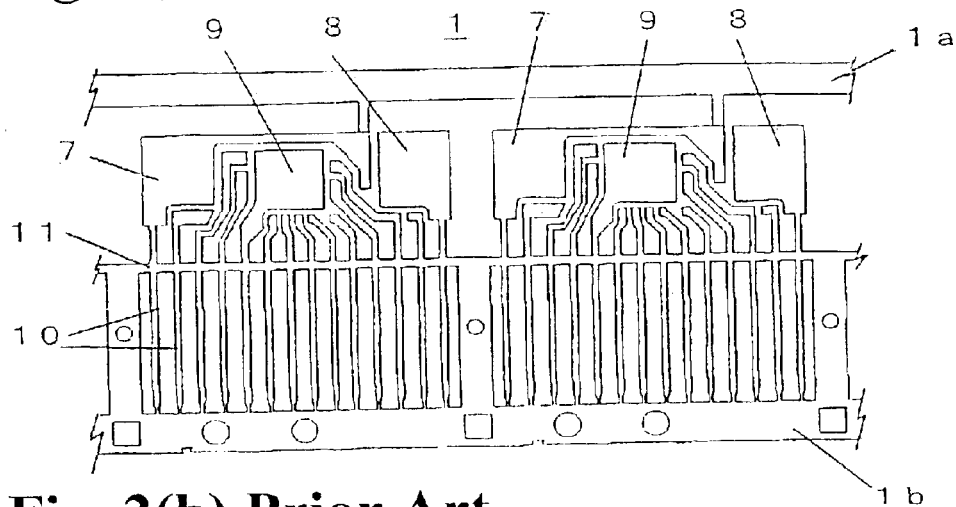
Figure 2B:
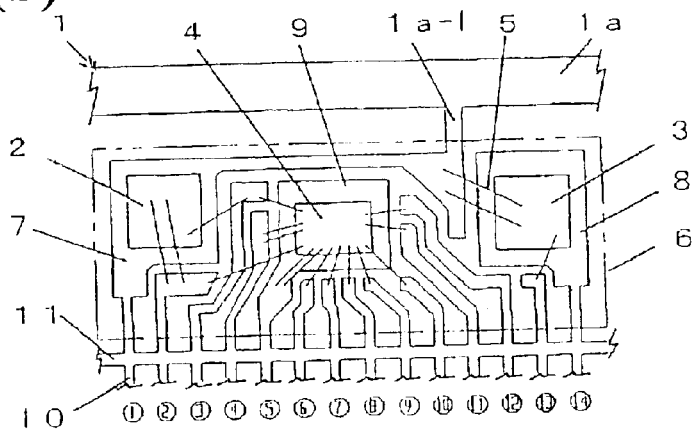
Figure 2C:
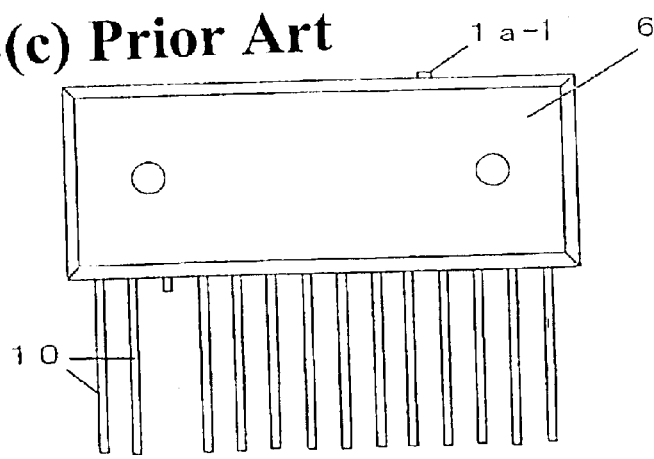

In the embodiment, die pads 7, 8 and 9, on which power elements 2 and 3 and a control IC 4 are to be mounted, are formed on a lead frame 1 in the same pattern as in FIG. 2(a). Terminal leads 10 are drawn and aligned in a row on one side, and separated from the die pads 7 to 9. A plurality of the leads (two in the embodiment) is drawn from the respective terminals corresponding to a main circuit and a control power supply in accordance with an outer dimension of the semiconductor device, as shown in FIG. 2(a). Further, dummy leads 10a (three leads with terminal numbers 3, 17, and 21 in FIG. 1(b)) are provided between the leads 10 connected to the main circuit terminals with different potentials. The leads 10 with terminal numbers 1 to 23 are arranged with a regular pitch interval (e.g. 1.27 mm). A dam bar 11 is formed to cross the leads 10 at a boundary between the inner leads and the outer leads. In the present embodiment, the side rail 1a formed at the die pad side shown in FIG. 1(a) is omitted, and a side rail 1b extending continuously from ends of the terminal leads 10 is used to transport the lead frame 1 pitch by pitch. Inner ends of the dummy leads 10a are cut in advance along a mold line of a resin package 6 as indicated by a hidden line in FIG. 1(b).

In a process of assembling a semiconductor device using the lead frame 1 constructed as described above, the power elements 2 and 3 and the control IC 4 are mounted (die-bonded) on the die pads 7, 8 and 9 of the lead frame 1 as shown in FIG. 1(b), and bonded by the wires 5 for internal wiring. In the next resin-molding step, the lead frame 1 is set in a molding die to seal a portion inside the mold line with a resin to form the resin package 6. It should be noted that the molding die is formed in conformity with the arrangement of the terminal leads shown in FIG. 1(b). In the lead cutting step following the resin-molding step, unnecessary terminal leads 10, except for those serving the external lead-through terminals, as well as the dummy leads 10a are cut and removed along with the dam bar 11 and the side rail 1b to complete the semiconductor device. It should be noted that small protrusions 6a remaining on a surface of the resin package 6 represent resin residues protruding beyond a cavity of the molding die toward the end faces of the dummy leads 10a in the resin-molding step.

In the assembled semiconductor device using the lead frame 1 according to the present embodiment, there are advantages as described below as compared with the assembled semiconductor device using the conventional lead frame shown in FIG. 2(a).

First, it is possible to reduce the material cost of the lead frame because the side frame 1a at one side is omitted. Further, an insulating process after the resin-molding step is not necessary because the tie bar 1a-1 does not remain or is not exposed from the surface of the resin package 6 after cutting as shown in FIG. 2(c) Further, since the number of the leads 10 increases the strength (flexural rigidity) of the lead frame itself, the semiconductor device can be assembled without any defects while preventing deformation and displacement of the lead frame in a sequence of the steps such as the die bonding, wire bonding, and resin sealing performed on the lead frame. Further, the dummy leads 10a are removed after the resin-molding step to increase the pitch intervals between the main circuit terminal leads arranged at both sides of the dummy leads 10a, thereby ensuring a distance enough for insulation to withstand the main circuit voltage.

Further, when upgrading a version of the semiconductor device by adding a protective function or the like, it is not necessary to change the number and the arrangement of the terminal leads 10 relative to the basic pattern of the lead frame. It is possible to use the original leads 10 formed in advance for the new version semiconductor device only by changing the pattern of the lead frame, i.e. the inner leads, die pads and dummy leads may be extended inward to be used as terminal leads. Therefore, it is not necessary to produce a new molding die, and it is possible to use the existing molding die as it is for the resin-molding without any trouble, thereby reducing the investment for additional equipment.

As described above, according to the present invention, the lead frame for the resin-molded semiconductor device is provided with the die pads for separately mounting the chips of the power elements and the control IC thereon; the terminal leads arranged in a row at one side and drawn from the die pads, and the main circuit, the control power supply and the signal circuit separated from the die pads; and the dam bar connecting the terminal leads. In at least the power elements, the main circuit terminals corresponding to the power elements for the control IC and control power supply terminals, the plurality of the leads is formed and drawn in advance. Then, the power elements and the control IC mounted on the die pads are internally wired. After the lead frame is set in the mold die and is resin-molded, specific leads that are not used as the terminal leads are selected among the plurality of the leads, and the specific leads are cut and removed along with the dam bar. With this arrangement, the semiconductor device assembled by using the lead frame according to the present invention achieves effects as described below as compared with the semiconductor device assembled by using the conventional lead frame.

Since the strength of the lead frame itself is improved by increasing the number of the leads, the semiconductor device can be assembled without any defects while preventing the lead frame from warping or displacing in the sequence of the semiconductor device assembling steps such as the die bonding, the wire bonding, and the resin-molding performed on the lead frame. Further, due to the increase in the number of the leads, number of times that the inner leads are led for patterning is decreased to reduce the wiring space. It is therefore possible to reduce the size of the package.

Further, in case where the version of the semiconductor device is upgraded by adding a protective function and the like, it is possible to cope with the version upgrade by changing only a part of the pattern of the inner leads and the die pads without modifying the arrangement of the outer leads in the basic pattern of the lead frame. Since the resin package can be molded by using the existing molding die as it is without a new molding die, it is possible to reduce the cost for additional equipment and improve the cost performance.

Further, according to the invention, the side rail of the lead frame is formed at only one side, and is connected to the ends of the terminal leads. Since the side rail at the other side is omitted, it is possible to lower the material cost of the lead frame and to decrease the number of the steps required for cutting the tie bar after the resin-molding. Further, it is possible to eliminate the insulating process because the tie bar does not remain or is not exposed from the outer surface of the resin package after cutting the tie bar.

Further, according to the invention, the dummy leads are formed in parallel between the leads corresponding to the main circuit terminals with different potentials, and the dummy leads are cut and removed along with the dam bar after the resin-molding. This increases the pitch intervals between the main circuit terminal leads arranged at both sides of the dummy leads to ensure the distance enough for insulation required for withstanding the main circuit voltage.

According to the invention, the inner ends of the dummy leads are cut along the mold line of the resin package. With this arrangement, in the resin-molding step, the dummy leads prevent leakage of the resin from the molding die, and after the resin sealing step, the dummy leads can easily be removed.

While the invention has been explained with reference to the specific embodiments of the invention, the explanation is illustrative and the invention is limited only by the appended claims.

What is claimed is:

1. A lead frame for a semiconductor device sealed with a resin, comprising:

die pads for mounting chips, first leads connected to the die pads, second leads to be connected to the chips, and at least one spare lead, said first, second and at least one spare leads being disposed parallel to each other at one side of the lead frame, and a dam bar laterally connecting all the leads, said dam bar being located so that said dam bar and at least predetermined lead in said all the leads are removed from the lead frame after the chips are mounted on the die pads and connected to the second leads, and a circuit portion of the semiconductor device is sealed with the resin.

2. A lead frame according to claim 1, further comprising one side rail formed only at the one side of the lead frame and connected to distal ends of all the leads.

3. A lead frame according to claim 2, wherein said second leads include a main circuit lead for a main circuit having a potential different from that of other leads, and said at least one spare lead is a dummy lead formed parallel to the first and second leads and disposed adjacent to the main circuit lead, said dummy lead being removed after the semiconductor device is sealed.

4. A lead frame according to claim 3, wherein said dummy lead includes an inner end cut along a line where the resin seals.

5. A lead frame according to claim 1, wherein said chips include a power element and a control IC, and said second leads includes leads for the power element and the control IC.

6. A lead frame according to claim 5, wherein said dam bar extends in a direction perpendicular to a direction that all the leads extend.

* * * * *

UNITED STATES PATENT AND TRADEMARK OFFICE
CERTIFICATE OF CORRECTION

PATENT NO. : 6,818,971 B2
DATED : November 16, 2004
INVENTOR(S) : Yoshinori Oda and Atsushi Maruyama It is certified that error appears in the above-identified patent and that said Letters Patent is hereby corrected as shown below:

Column 1,
Line 7, remove comma after "multi-chip"

Column 6,
Line 38, after "least" insert -- one --

Signed and Sealed this

Fifteenth Day of March, 2005

JON W. DUDAS
*Director of the United States Patent and Trademark Office*